(12) United States Patent
Cheung et al.

(10) Patent No.: US 11,501,986 B2
(45) Date of Patent: Nov. 15, 2022

(54) WAFER PROFILING FOR ETCHING SYSTEM

(71) Applicant: Applied Materials, Inc, Santa Clara, CA (US)

(72) Inventors: Jeffrey Chi Cheung, Hayward, CA (US); John Ghekiere, Marion, MT (US); Jerry D. Leonhard, Kalispell, MT (US); David P. Surdock, Kalispell, MT (US); Benjamin Shafer, Hungry Horse, MT (US); Ray Young, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 15/587,840

(22) Filed: May 5, 2017

(65) Prior Publication Data

US 2017/0323806 A1 Nov. 9, 2017

Related U.S. Application Data

(60) Provisional application No. 62/489,329, filed on Apr. 24, 2017, provisional application No. 62/332,992, filed on May 6, 2016.

(51) Int. Cl.
*H01L 21/67* (2006.01)
*H01L 21/66* (2006.01)

(52) U.S. Cl.
CPC .... *H01L 21/6708* (2013.01); *H01L 21/67253* (2013.01); *H01L 21/67259* (2013.01); *H01L 21/67271* (2013.01); *H01L 22/12* (2013.01); *H01L 22/26* (2013.01)

(58) Field of Classification Search
None
See application file for complete search history.

(56) References Cited

U.S. PATENT DOCUMENTS

| 5,853,483 A * | 12/1998 | Morita ............ B05C 11/08 118/712 |
| 7,144,459 B2 | 12/2006 | Thompson et al. |
| 2004/0004724 A1 | 1/2004 | Kim et al. |

(Continued)

FOREIGN PATENT DOCUMENTS

| JP | 2005-114461 | 4/2005 |
| KR | 10-1998-0045907 | 9/1998 |

(Continued)

OTHER PUBLICATIONS

International Search Report and Written Opinion in International Application No. PCT/US2017/031302, dated Jul. 31, 2017, 12 pages.

(Continued)

*Primary Examiner* — Ram N Kackar
(74) *Attorney, Agent, or Firm* — Fish & Richardson P.C.

(57) ABSTRACT

A substrate etching system includes a support to hold a wafer in a face-up orientation, a dispenser arm movable laterally across the wafer on the support, the dispenser arm supporting a delivery port to selectively dispense a liquid etchant onto a portion of a top face of the wafer, and a monitoring system comprising a probe movable laterally across the wafer on the support.

9 Claims, 3 Drawing Sheets

(56) References Cited

U.S. PATENT DOCUMENTS

| | | | | |
|---|---|---|---|---|
| 2004/0139985 | A1* | 7/2004 | Hegedus | B08B 3/02 |
| | | | | 134/1.3 |
| 2006/0057804 | A1* | 3/2006 | Saito | H01L 21/308 |
| | | | | 438/254 |
| 2006/0144330 | A1* | 7/2006 | Takekuma | H01L 21/6715 |
| | | | | 118/682 |
| 2007/0175863 | A1* | 8/2007 | Koyata | H01L 21/02019 |
| | | | | 216/84 |
| 2008/0099443 | A1* | 5/2008 | Benvegnu | B24B 37/013 |
| | | | | 216/84 |
| 2010/0271621 | A1 | 10/2010 | Levy et al. | |
| 2012/0131815 | A1 | 5/2012 | Kraus et al. | |
| 2014/0242731 | A1* | 8/2014 | Mauer | H01L 22/12 |
| | | | | 438/8 |
| 2015/0273534 | A1* | 10/2015 | Ootagaki | B08B 3/08 |
| | | | | 134/18 |

FOREIGN PATENT DOCUMENTS

| | | |
|---|---|---|
| KR | 10-2003-0080196 | 10/2003 |
| KR | 10-2009-0012364 | 2/2009 |
| KR | 10-2015-0122661 | 11/2015 |

OTHER PUBLICATIONS

TW Office Action in Taiwanese Appln. dated Nov. 11, 2020, 13 Pages(with English Translation).

KR Office Action in Korean Appln No. 10-2018-7035472, dated Jun. 30, 2021, 16 pages (with English translation).

Office Action in Korean Appln. No. 10-2018-7035472, dated Jan. 24, 2022, 14 pages (with English translation).

* cited by examiner

WAFER PROFILING FOR ETCHING SYSTEM

CROSS-REFERENCE TO RELATED APPLICATIONS

This application claims priority to U.S. Provisional Application Ser. No. 62/489,329, filed Apr. 24, 2017, and to U.S. Provisional Application Ser. No. 62/332,992, filed on May 6, 2016, each of which is incorporated by reference.

TECHNICAL FIELD

This disclosure relates to substrate monitoring in an etching system.

BACKGROUND

An integrated circuit is typically formed on a substrate by a sequential deposition, patterning, and etching of conductive, semiconductive, or insulative layers on a silicon wafer. One fabrication step involves depositing a conductive layer, patterning an etch mask to protect the conductive layer, and etching the conductive layer using a liquid etchant ('wet etching') to form isolated conductive traces. The etch mask layer protects the masked regions of the film from being etched. For some applications, the isolated conductive traces are formed by etching the deposited conductive layer until the unmasked regions of the conductive layer 'clears' and the top surface of the underlying layer is exposed. In some applications, a detection of the clearing of the unmasked regions is called endpoint detection, and can be used to determine when to stop the etching process.

Variations of the upstream process steps and of the wet etching process typically result in non-uniformities of the etched conductive traces across the wafer. The non-uniformities can be determined, for example, using critical dimension (CD) measurements. Methods of CD measurements include top-down measurements or cross-section measurements using a scanning electron microscope (SEM). Cross-sections can be prepared, for example, using a focused ion beam (FIB) process. Cross-section measurements of the conductive traces can provide information including the widths, heights, and degrees of undercut of the traces.

SUMMARY

In one aspect, a substrate etching system includes a support to hold a wafer in a face-up orientation, a dispenser arm movable laterally across the wafer on the support, the dispenser arm supporting a delivery port to selectively dispense a liquid etchant onto a portion of a top face of the wafer, and a monitoring system comprising a probe movable laterally across the wafer on the support.

Implementations may include one or more of the following features.

The probe may be secured to and move with the dispenser arm. The probe may be secured to and move with a second arm.

The monitoring system may include an optical monitoring system. The optical monitoring system may include a light source, a detector, and an optical component to carry light from the light source to the substrate and carry reflected light from the substrate to the detector. The optical component may include an optical fiber, and the probe may include an end of the optical fiber positioned adjacent the support.

A controller may be configured to receive measurements from the monitoring system. The controller may be configured to determine if an improper wafer type is placed on the support. The controller may be configured to detect misplacement of the wafer on the support. The controller may be configured to detect variations in an etching rate from a target etch rate profile, and adjust a dwell time of the port or a flow rate of the etchant to reduce variations in the etching rate from the target etch rate profile.

In another aspect, a substrate etching system includes a support to hold a wafer in a face-up orientation, a dispenser arm movable laterally across the wafer on the support, the dispenser arm supporting a delivery port to selectively dispense a liquid etchant onto a portion of a top face of the wafer, a monitoring system comprising a probe movable laterally across the wafer on the support, and a controller configured to cause the probe to move laterally across the wafer such that the monitoring system generates measurements at a plurality of different radial positions on the wafer, to receive the measurements from the monitoring system, to determine whether a processing endpoint has been reached for each zone of a plurality of zones on the wafer based on measurements from radial positions within the zone, and to cause the dispenser to stop dispensing of the liquid etchant from the delivery port upon determining that endpoint has been reached for all of the zones.

Implementations may include one or more of the following features.

The monitoring system may include an optical monitoring system. The controller may be configured to determine that an endpoint been reached by detecting a change in intensity at a wavelength of light monitored by the optical monitoring system. The controller may be configured to cause the dispenser to stop dispensing of the liquid etchant to a respective zone upon determining that endpoint has been reached for the respective zone. The controller may be configured to cause the dispenser to continue across the plurality of zones until determining that endpoint has been reached for all of the zones.

In another aspect, a substrate etching system includes a support to hold a wafer in a face-up orientation, a reservoir for a liquid etchant bath, a dispenser arm movable laterally across the wafer on the support, the dispenser arm supporting a delivery port to selectively dispense liquid etchant from the bath onto a portion of a top face of the wafer, a monitoring system comprising a probe movable laterally across the wafer on the support, and a controller configured to cause the probe to move laterally across the wafer such that the monitoring system generates measurements at a plurality of different radial positions on the wafer, to receive the measurements from the monitoring system, to determine an etching rate from the measurements, to compare the etching rate to a target rate, and to at least one of indicate an alert to change the etchant bath or adjust a processing parameter of the etchant bath in the reservoir to reduce a variation of etching rate from the target rate.

Implementations may include one or more of the following features.

The processing parameter may be a concentration of etchant. The controller may be configured to adjust the processing parameter for a subsequent wafer to be processed on the support. The controller may be configured to store a starting thickness, to determine that a processing endpoint has been reached from the measurements, to measure an elapsed time from a starting of etching until the processing endpoint. The monitoring system may include an optical monitoring system and the controller may be configured to determine that a processing endpoint has been reached by detecting a change in intensity at a wavelength of light monitored by the optical monitoring system.

Certain implementations may have one or more of the following advantages. Individual endpoints can be detected across multiple radial zones of a substrate. Real time measurements of the radial variations in film clearing can be obtained. Within-wafer etch non-uniformity and wafer-to-wafer etch non-uniformity (WIWNU and WTWNU) can be reduced. The etchant bath life can be extended. Introduction of improper substrate type can be determined. Substrate misplacement on a support can be determined. An etch rate of the process can be determined. High scoring failure mode, effects and criticality analysis (FMECA) failure mechanisms can be detected.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
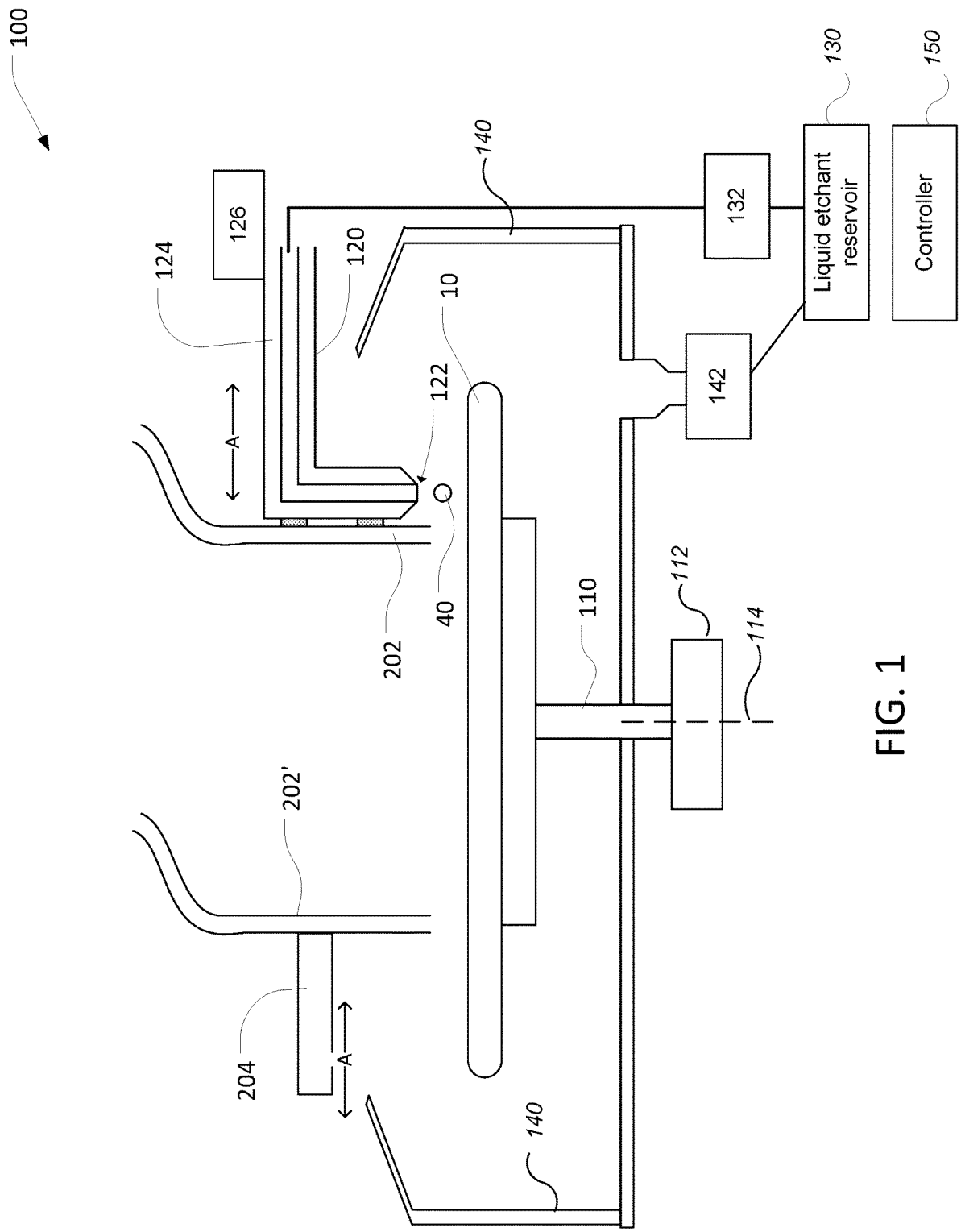
FIG. 1 is a schematic cross-sectional side view of an etching system.

Non-uniformities of a wet etching process or variations in the thickness of the layer on the incoming workpiece can cause clearing of the film being etched to occur in some regions of a wafer before some other regions of the wafer. For example, the last region to clear can take twice as long as the first region to clear. To ensure that the film has cleared over the entire wafer, the etching process can be run until the slowest region has cleared, resulting in a 100% over-etch of the first region.

A wet etching process is typically isotropic, resulting in an undercutting of the film at the edges of the etch mask layer. The degree of undercut increases as etching time is increased. Therefore, over-etching some regions of the wafer can cause excessive undercutting of the etched traces. Excessive undercutting results in excessive variations in characteristics (e.g., sheet resistance) of the fabricated products, so characterization and mitigation of the non-uniformities are desired.

Characterization of the non-uniformities of a wet-etch process can be performed using various methods. One method is blanket wafer qualification, in which un-patterned wafers with a uniform layer of film is used as a proxy for product wafers that have patterns. By etching the blanket wafers for a fixed amount of time and measuring the resulting variations of the film thickness across the wafer, the non-uniformities of the etching process can be characterized. However, this method is blind to variations in etching caused by different pattern types having different pattern densities, orientations, and aspect ratios. For example, changing pattern density causes a local change in characteristics and/or behavior of the liquid etchant due to loading effects, affecting the etch rate. As another example, pattern orientations can affect the flow and spreading of the liquid etchant, causing non uniformities. Furthermore, high aspect ratios of the patterned features can induce 'shadowing' of some areas of the wafer by redirecting of the liquid etchant during the dispensing and spreading steps.

Another method for characterizing non-uniformities is CD measurement using a SEM. However, this method is not sensitive to under bump metallization (UBM) scale variation, as plated features are many times larger than the films being etched.

A method for characterizing the non-uniformities in trace undercuts is cross-sectional analysis using FIBs and SEMs. However, cross-section preparation using a FIB is time consuming and destructive. Due to the time consuming nature of sample preparation using a FIB, only a very limited points of a wafer can be sampled, resulting is low spatial resolution of non-uniformities across the wafer. Furthermore, due to the destructive nature of sample preparation using a FIB, only a very small number of product wafers can be sampled, resulting in incomplete characterization of non-uniformities from wafer to wafer.

Typical etching systems are programmed to over-etch a wafer to ensure that the entire wafer has reached the endpoint using a conservatively-timed etch. The duration of the timed-etch is typically determined using previously acquired metrology data, e.g., data from blanket wafer qualification, CD measurements, and cross-section measurements.

Some etching systems use an endpoint detection system that can estimate the endpoint status of a wafer based on a single measurement. The single measurement can be based on a single point on a wafer, e.g., the center. However, a single point endpoint detection scheme cannot account for the non-uniformities across the wafer, resulting in false endpoint detection or over-etching.

Thus, it would be advantageous to have a system that can: measure uniformity of film clearing without external metrology (e.g., SEM); profile actual production wafers without destructive analysis; be applied to multiple product types without recalibration; and correct non-uniformity of film clearing to reduce over etching and variations in undercutting. By scanning a probe across the wafer during etching, measurements at multiple locations can be collected, thus permitting over etching and variations in undercutting to be reduced.

FIG. 1 illustrates an example of a substrate etching system 100. A wafer 10 is supported face-up by a rotatable spindle 110. For example, a motor 112 can drive the rotatable spindle 110 to rotate the spindle 110 about an axis 114.

A delivery arm 120 is positioned over the wafer 10, and a liquid etchant 40 can be delivered through a port 122 at the end of the delivery arm 120. The liquid etchant 40 can be supplied from a liquid etchant reservoir 130, e.g., by a pump 132. The liquid etchant 40 can flow through a passage 124 in or on the delivery arm 120 (e.g., tubing attached to the arm). The arm 120 is movable laterally across the wafer 10, e.g., as shown by arrow A, by an actuator 126. In general, movement of the arm 120 is sufficient that the delivery port 122 is positionable anywhere from the center to the edge of the wafer 10.

One or more sidewalls 140 are positioned around the spindle 110 to contain and collect the liquid etchant 40 that leaves the surface of the wafer 10 (e.g., caused by a rotation of the wafer). The etchant can drain into a collector 142. In some implementations, the etchant can be recycled and returned to the reservoir 130. The collector 142 can include a filter to treat the used etchant before the etchant is returned to the reservoir 130.

An unillustrated robot can lower the workpiece 10 into place on the spindle 110, e.g., through an opening in the top of the sidewalls 140. The position of the arm 120 can be coordinated with the robot to prevent collision, e.g., the arm 120 can be moved so that it does not overlie the spindle 110 when the workpiece is lowered into place.

A controller 150 controls the operation of the substrate etching system 100. For example, the controller 150 can be coupled to the motor 112, the actuator 126 and the pump 132. The controller 150 can be implemented with a programmable computer.

During a typical operation of the substrate etching system 100, the wafer 10 is rotated by the rotatable spindle 110 while the liquid etchant 40 is dispensed onto the surface of the wafer 10 by the delivery arm 120. The rotation can enable gapless dispensing of the liquid etchant 40 over the entire 2D surface of the wafer 10 using a 1D linear motion of the delivery arm 120. Furthermore, the rotation can enable even distribution of the liquid etchant 40 once the liquid is dispensed on the wafer surface due to the generated centrifugal force (e.g., the liquid etchant 40 is radially redistributed along the surface of the wafer 10)

In some implementations, the rotatable spindle 110 can provide vacuum suction to temporarily affix the wafer 10 to the spindle 110. In some implementations, the rotatable spindle 110 can hold the wafer 10 along the edges of the wafer 10.

In some implementations, the delivery arm 120 can be configured to move linearly along a radial direction of the wafer 10. In some implementations, the delivery arm 120 can be configured to move in an arc across the surface of the wafer 10. In some implementations, the delivery arm 120 can be swept from the center of the wafer to the edge of the wafer and back to the center in about 0.5-3 seconds, e.g., 1.2 seconds.

The liquid etchant 40, sometimes called a 'chemistry', is typically a mix of various chemical compounds in a solvent. For example, the solvent can include deionized water and hydrogen peroxide. Different chemistries can be used to etch different film materials. For example, chemistries containing ferric chloride can be used to etch copper.

In some implementations, the liquid etchant 40 is reclaimed and used for two or more etching cycles. In some implementations, the liquid etchant reservoir 130 can be configured to store the liquid etchant 40 after being dispensed and used for etching the wafer 10. In some implementations, the sidewall 140 can be configured to redirect the dispensed liquid etchant 40 that leaves the surface of the wafer 10 to the reservoir 130.

Various factors can affect the etch rate of the liquid etchant 40. One factor can be the concentration of the liquid etchant 40. Another factor can be the temperature of the liquid etchant 40, as the rate of chemical reactions causing the etching typically increases when the temperature of the liquid etchant 40 increases, and vice versa. Another factor can be the age of the liquid etchant 40, as some chemistries (e.g., a single use chemistry) breakdown and degrade over time. Another factor can be the number was wafers processed using the reclaimed liquid etchant.

Figure 2:
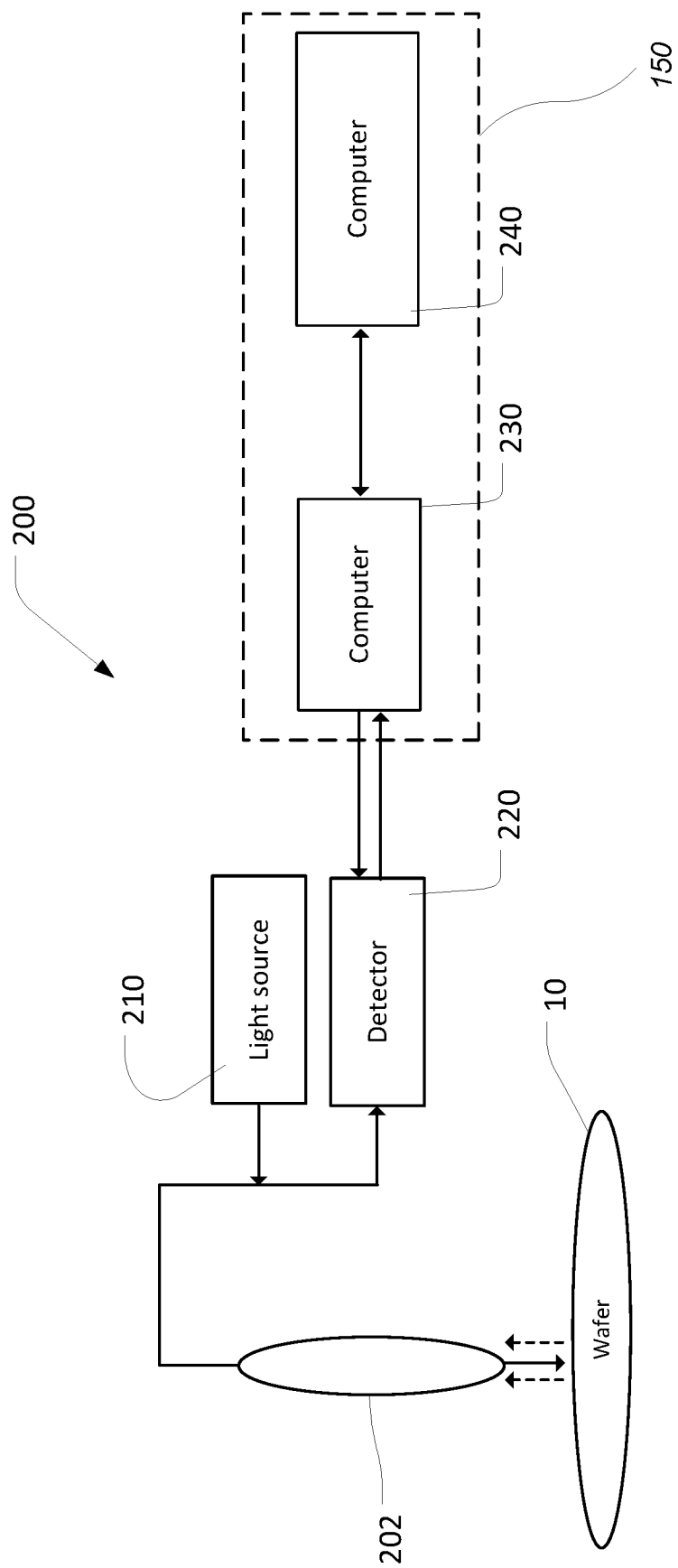
FIG. 2 is a schematic diagram of an optical monitoring system.

FIG. 2 illustrates an optical monitoring system 200 for the substrate etching system 100. Referring to FIGS. 1 and 2, the optical monitoring system 200 includes a probe 202 positioned over the wafer 10. The probe is movable laterally across the wafer 10. In general, the probe is positionable anywhere from the center to the edge of the wafer 10. In some implementations, the probe 202 is attached to and moves with the delivery arm 120.

In some implementations, the probe 202 is movable by a separate arm 204. The separate arm 204 can enable monitoring of the wafer 10 independent of the dispensing location of the liquid etchant 40. The separate arm 204 can be configured to move linearly along a radial direction of the wafer 10. In some implementations, the separate arm 204 can be configured to move in an arc across the surface of the wafer 10. In some implementations, the separate arm 204 can be swept from the center of the wafer to the edge of the wafer and back to the center in about 0.5-3 seconds, e.g., 1.2 seconds. Motion of the arm 120 and the arm 204 can be coordinated by the controller 150 to avoid collision.

Referring to FIG. 2, the optical monitoring system 200 includes a light source 210 and a detector 220. In some implementations, the probe 202 can include an optical fiber that receives light from the light source 210, directs the light onto the surface of the wafer 10, receives reflected light back from the wafer 10, and directs the reflected light to the detector 220. By moving the arm 120 or 204 laterally, the end of the optical fiber can be positioned at a desired radial location on the wafer 10. However, other techniques are can be used. For example, a light beam can be directed along the arm by mirrors, or the probe 202 can include a liquid light guide that receives light from the light source 210, directs the light onto the surface of the wafer 10, receives reflected light back from the wafer 10, and directs the reflected light to the detector 220.

In some implementations, the probe 202 also includes a collimator for projecting a collimated spot of light on the surface of the wafer 10, and to increase the coupling efficiency of the reflected light back into the optical fiber or the liquid light guide. The size of the collimated spot of light, for example can be 1-10 mm in diameter, e.g., 1 mm, 2 mm, 5 mm, or 10 mm in diameter. The spot size can be chosen based on desired number of radial sampling points and the diameter of the wafer.

The optical monitoring system 200 can be used to detect a change in a reflectance of the surface of the wafer 10 by measuring the intensity of the reflected light. For example, a metal film to be etched can be stacked on top of a non-metallic underlayer that is less reflective than the metal film. In such a case, a change in the reflectance occurs when the liquid etchant 40 clears the metal film and exposes the less reflective underlayer. This change in the reflectance can be analyzed by the controller 150 to determine whether the metal film has been fully etched and the endpoint has been reached.

In some implementations, the light source 210 is a flash lamp. A flash lamp typically provides broadband light of high radiant intensities desirable for performing spectroscopic measurements. Various types of flash lamps include Xenon flash lamp and Krypton flash lamp. In some implementations, the light source 210 is an amplified spontaneous emission source. In some implementations, the light source 210 is a halogen light source. In some implementations, the light source 210 is a laser.

In some implementations, the detector 220 is a spectrometer. In combination with a broadband light source such as a flash lamp, the spectrometer can measure the reflectance of the surface of the wafer 10 at different wavelengths (reflectance spectrum') to provide additional information about the surface of the wafer 10. In some implementations, the spectrometer has 8 channels and a polling interval of 16 ms, generating a measurement at every polling interval. In some implementations, the spectrometer has 4 channels and a polling interval of 8 ms.

The data from the detector 220 (Reflectance data') are sent to one or more computers 230 and 240 that are part of the controller 150. The computers are programmed to analyze the data. For example, one or more of the computers 230, 240 can have a processor and a storage device with computer readable media having instructions for causing the computer to perform the functions described below, e.g., detect if an improper wafer type is introduced into the chamber for processing, detect misplacement of the wafer on the rotor, or detect variations from the expected etch rate, based on the data received from the detector 220. One computer, e.g., computer 230 can be dedicated to analysis of the spectral data from the detector 220 and generate the indication of whether endpoint has been reached, and another computer, e.g., computer 240 can be dedicated to control of the etching system based on the endpoint data from the computer 230. Rather than separate computers, 230, 240, could be separate functional modules within a single computer.

In some implementations, the computer 230 receives, processes, and stores data generated by the detector 220. In some implementations, the computer 230 also receives the position data of the delivery arm 120, the separate arm 204 when present, and the rotational rate of the spindle 110.

In some implementations, the controller 150 can analyze the received reflectance spectrum to determine the material of the reflecting surface. In general, different types of metals can have different reflectance spectra. For example, copper can have a reflectance peak around 620 nm, and titanium can have a reflectance peak at 578 nm. Therefore, a spectrometer with sufficient wavelength resolution can be used in some cases to resolve the differences in reflectance spectra between two different materials (e.g., a copper film and a titanium film). Determination of material can be useful, for example, when etching a copper film stacked on top of a titanium film as the controller 150 may be able to determine when the copper layer is completely etched, exposing the underlying titanium layer. For example, a titanium film can be used as a barrier layer to separate the copper layer from a dielectric layer that underlies the barrier layer. In some implementations, when the controller 150 determines that the reflectance signal is from the underlying layer, the controller 150 can determine that an endpoint has been reached. In some implementations, in response to the detected change, the controller can then change the type of the liquid etchant 40, e.g., from a copper etchant to a titanium etchant to etch the titanium layer.

In some implementations, the controller 150 can use the received reflectance spectrum to discriminate between the top metal film and the underlying dielectric film. For example, the thickness of the dielectric layer under the conductive film can be determined by fitting a thin-film interference equation to the measured reflectance spectrum. In some cases, the refractive index and the thickness of the underlying dielectric layer can result in a reflectance signal that is substantially similar to the reflectance signal of the top metal film at a particular band of wavelengths. In such cases, additional reflectance data at a different band of wavelengths can be used to distinguish whether the reflection is that of the metal or of the underlying dielectric layer. In some implementations, when the controller 150 determines that the reflectance signal is from the underlying dielectric layer, the controller 150 can determine that an endpoint has been reached.

In general, the endpoint determination from the reflectance spectrum can be applied to multiple types of product wafers without recalibration, as the reflectance spectrum is an inherent characteristic of a material, which can be independent from the different patterns of the product wafers.

In some implementations, the controller 150 can process the received reflectance data to generate a mapping of the reflectance data or endpoint statuses across the wafer 10. In some implementations, the surface of the wafer 10 can be divided into multiple zones.

Figure 3:
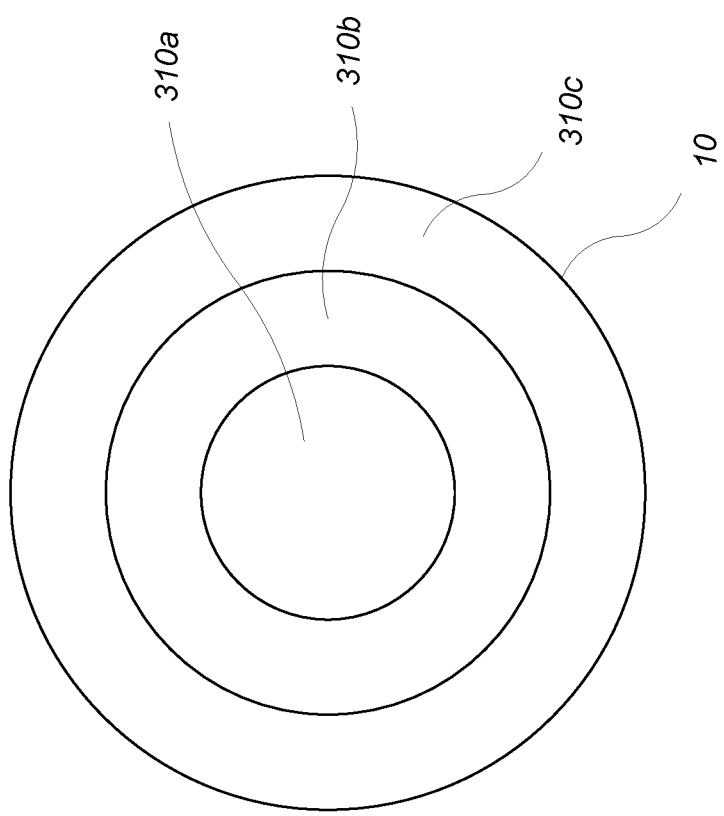
FIG. 3 is a top view of a substrate having multiple zones.

FIG. 3 is a top view of a substrate having multiple zones. The wafer 10 includes annular zones 310a, 310b, and 310c. While three zones are shown, the number of annular zones can be changed. For example, the number of zones can be 2, 4, 8, 16, or 32. In some implementations, the number of annular zones can be determined based on the size of the wafer 10. In some implementations, the annular zones 310a, 310b, and 310c can have areas of overlap with adjacent annular zones. The overlapping can provide some azimuthal awareness.

In some implementations, the controller 150 can analyze a time stamp of the arm position data and the time stamp of the reflectance data to determine the arm position associated with the reflectance data. The arm position data can be analyzed to assign the reflectance data to the annular zones 310a, 310b, or 310c, creating a radial map of reflectance data across the surface of the wafer 10.

In some cases, each of the annular zones 310a, 310b, and 310c is assigned more than one reflectance data within a single scan. The rotational rate of the spindle 110 can be used to determine the relative locations of multiple reflectance data assigned to the annular zone. For example, when multiple reflectance data are measured while the arm position remains fixed, measured reflectance data points will fall within the same annular zone. In some implementations, the spindle rotation rate is used to calculate relative azimuthal separation of the reflectance data. In some implementations, the multiple data points within the annular zone are analyzed to determine azimuthal non-uniformities. The multiple data points can be averaged to determine an average reflectance of the annular zone. In some cases, the averaging can reduce the noise in the reflectance measurement of the annular zone, increasing the reliability of endpoint detection.

In some implementations, the controller 150 determines an individual endpoint status for each of the annular zones 310a, 310b, and 310c. The reflectance data assigned to the annular zones 310a, 310b, and 310c can be analyzed as described above to determine whether the endpoint has been reached for each zones. For example, a binary endpoint status can be assigned to each zones—either endpoint reached or endpoint not reached. In some implementations, a radial map of endpoint status can be created across the surface of the wafer 10.

In some implementations, multiple data points within the annular zone 310a, 310b, or 310c is analyzed to improve confidence of endpoint determination. For example, assuming binary endpoint status 1 indicates that endpoint has been reached, then the endpoint status of the annular zone can be set to 1 when every data point within the zone has an endpoint status of 1.

In some implementations, the controller 150 periodically scans the probe 202 over the surface of the wafer 10 to detect a change in the endpoint status of the annular zones 310a, 310b, and 310c over time. Each scan can be time stamped and processed to generate a time-resolved radial endpoint status map. For example, the time-resolved radial endpoint status map can display the order in which the different zones have reached their respective endpoint. The time interval for the periodic scanning can be determined based on various factors. For example, the time interval can be shortened if the etch rate of the process is high.

In some implementations, the system 100 processes the wafer 10 until the controller 150 determines that the endpoints have been reached for all annular zones. Individual detection of endpoints for different annular zones can improve yield of the process by confirming that the entire wafer has been completely processed.

In some implementations, different zones can have different criteria for determining whether the endpoint has been reached for the zone.

In some implementations, the etch rate of the annular zones 310a, 310b, and 310c can be individually controlled. In some implementations, the delivery arm 120 can selectively dispense the liquid etchant 40 to different annular zones to slow down the etch rate at non-dispensed zones. In some implementations, the flow rate of the liquid etchant 40 can be changed to control the etch rate of the annular zones. In some implementations, the dwell time of the dispensing port over the annular zone while dispensing can be changed to control the etch rate.

In some implementations, the controller 150 can stop the dispensing of the liquid etchant 40 on the annular zones that have reached endpoint. The controller 150 can continue to dispense the liquid etchant 40 on annular zones that have not reached endpoint status, until all annular zones are determined to have reached endpoint.

In some implementations, the non-uniformities of the etching process can be corrected in the subsequent wafer. For example, the time-resolved radial endpoint status map of the previous wafer can reveal that the annular zone 310a has reached endpoint before the annular zone 310c did. In response, the controller 150 can change the etchant flow rate and/or dwell time at different annular zones to reduce variations in the etching rate of the zones from a uniform target etch rate. The reduction of variation in the etching rate can result in different zones reaching endpoints at similar times, reducing non-uniformities and over etching of the annular zones.

In some implementations, the non-uniformities of the etching process can be corrected in real time for the current wafer. For example, the controller 150 can process the time-resolved radial endpoint status map in real time, and the etchant flow rate and/or dwell time can be changed in response to certain annular zones reaching endpoints earlier than the other annular zones to reduce non-uniformities within the current wafer.

In some implementations, the controller 150 can be configured to determine the etch rate of the liquid etchant 40. For example, the controller 150 can determine an etch duration until an annular zone is cleared of the metal film using the time-resolved radial endpoint status map. This time information can be coupled with a starting thickness of the film at the annular zone stored on the controller 150 to calculate the etch rate. For example, the starting thickness can be generated by an upstream metrology tool.

The liquid etchant 40 can have a baseline etch rate for each type of film and pattern characteristics. For example, the baseline etch rate can be determined during process qualification. The currently determined etch rate can be different from the baseline etch rate for various reasons. For example, the liquid etchant 40 can be recycled after processing a wafer to reduce etchant consumption. The recycled etchant can have a reduced etch rate due to depletion or modification of chemical compounds responsible for etching. The etch rate can also change due to temperature. The etch rate can also change due to concentration of the etchant. The etch rate can also change due to degradation of the liquid etchant over time.

When the controller determines that the etch rate is outside of an acceptable range, various actions can be taken. One action can be creating an alert, e.g., an audio or visual signal to the operator of the system, to change the etchant bath to a fresh batch of etchant. Another action can be adjusting a processing parameter of the etchant bath in the liquid etchant reservoir 130. The processing parameters of the etchant bath can include the concentration and temperature of the liquid etchant. For example, the etch rate can be increased in some cases by increasing the concentration of the liquid etchant 40 by adding concentrated etchant into the reservoir 130. For example, the etch rate can be decreased by decreasing the concentration of the etchant by diluting it with an appropriate solvent (e.g., deionized water). For example, the etch rate can be increased in some cases by increasing the temperature of the liquid etchant 40 stored at the reservoir 130, which increase the temperature of the dispensed liquid etchant 40.

In some implementations, the etch rate determined by the controller 150 can be used to extend the useful life of the liquid etchant 40 reclaimed in the reservoir 130. The etch rate of the liquid etchant 40 can change, for example, based on its age and number of wafers etched. In etching systems without etch rate determination capability, the liquid etchant 40 reclaimed by the reservoir 130 may be emptied and refilled with a fresh supply of liquid etchant 40 based on a time interval or a number of wafers etched. The time interval or the number of wafers etched is typically set to be preventatively low, to prevent incomplete processing of the wafers in time-based etch systems. However, in some implementations, if the controller 150 determines that the etch rate of the liquid etchant 40 is lower than the baseline etch rate, the controller 150 can extend the etch duration to compensate for the slower etch rate. This compensation can enable extension of the useful lifetime of the liquid etchant 40 at a slight loss of throughput. In some implementations, a maximum allowed time to clear a given film can be set, and once the maximum allowed time is exceeded, the reservoir 130 can be emptied and refilled with a fresh supply of the liquid etchant 40.

In some implementations, the controller 150 can be configured to perform a pre-scan of the wafer 10 and determine whether the presented wafer is of a proper type. A product wafer has a known range of reflectance across the wafer. If the measurements from the optical monitoring system 200 is outside of the expected range of reflectance, the controller 150 can determine the wafer to be of an improper type. For example, an improper type of wafer can have a metal film that is different than the expected film. For example, an improper type of wafer can contain photoresist residues from an incomplete removal from an upstream process step. The photoresist residues can change the shape of the spectral reflectance curve by thin film interference effects. The photoresist residues can decrease the overall reflectance across the spectrum due to light absorption and/or scattering.

When a wafer is determined to be improper, the controller 150 can reject the improper wafer without processing, and flag the improper wafer for corrective action. For example, the corrective action can include cleaning of the photoresist residue. For example, the unexpected type of metal film can be analyzed to determine upstream processing errors. Rejection of improper wafer can improve process yield by stopping processing of wafers that may need corrective actions, as improper wafers can be damaged from processing before corrective actions have been taken.

In some implementations, the controller 150 can be configured to perform a pre-scan of the wafer 10 and determine a misplacement of the wafer 10 on the support (e.g., the rotatable spindle 110). Misplacement of wafer can cause a tilting of the surface of the wafer 10 with respect to the support surface. The tilting can cause an uneven distribution of the liquid etchant 40 due to the dispensed liquid etchant flowing towards the lower portion of the wafer, resulting in etching non-uniformities. In another example, misplacement of the wafer 10 can cause misalignment of the center of the wafer 10 with respect to the axis 114. The axial misalignment can cause uneven centrifugal force to be applied on the dispensed liquid etchant on the surface of the wafer 10, which can cause uneven distribution of the liquid etchant 40. Furthermore, axial misalignment can lead to dislocation of wafer from the support at high rotational rates (e.g., during wafer rinse and dry step).

In some implementations, tilting of the wafer can be detected by analyzing the magnitude of the reflectance data. Tilting of the wafer can cause the reflection direction of the collimated spot on the wafer to be different from the illumination direction. The misalignment of the reflected light with respect to the probe 202 can cause a reduction in collected light, resulting in reduced magnitude of the reflectance data. When the magnitude of the reflectance data is lower than an expected magnitude by a prescribed threshold (e.g., 5%, 10%, 20%, 50%, 75%, 90%), the controller 150 can determine the wafer to be misplaced.

In some implementations, the axial misalignment can be determined by making and analyzing two or more reflectance measurements across the wafer. Based on knowing the size of the wafer 10 and expected center of the wafer, the probe 202 can be positioned near the two opposing edges of the wafer 10. If the wafer 10 is axially misaligned, the collimated spot can miss the surface of the wafer 10 during one of the two measurements near the edge of the wafer 10. Missing the surface of the wafer 10 can result in a lower reflectance relative to the other measurement. When the difference in magnitude of the two measurements is larger than a prescribed threshold (e.g., 5%, 10%, 20%, 50%, 75%, 90%), the controller 150 can determine the wafer to be axially misaligned.

In some implementations, the processing of the reflectance data by the controller 150 can include normalizing of the received reflectance spectrum data. The normalization, for example, can be performed by adding up the individual spectral intensity values across the spectrum, and dividing each value by the sum. Normalization of the reflectance spectrum data can enable comparison of data from the optical monitoring system 200 across different instances of the substrate etching system 100 without needing to ensure strict chamber matching between the systems.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

A number of embodiments have been described. Nevertheless, it will be understood that various modifications may be made. Accordingly, other embodiments are within the scope of the following claims.

What is claimed is:
1. A substrate etching system, comprising:
a housing including a floor and a sidewall extending upwardly from the floor;
a rotatable spindle that extends through the floor;
a support on the rotatable spindle and positioned above the floor of the housing to hold a wafer in a face-up orientation in a volume enclosed by the housing and below a top edge of the sidewall;
a dispenser arm movable laterally over the top edge of the sidewall and across the wafer on the support, the dispenser arm supporting a delivery port extending downwardly below the top edge of the sidewall to selectively dispense a liquid etchant onto a portion of a top face of the wafer;
an optical monitoring system comprising a light source, a spectrometer, and an optical fiber to carry light from the light source to the wafer and carry reflected light from the wafer to the spectrometer, wherein an end of the optical fiber is secured to the dispenser arm adjacent the delivery port such that the end of the optical fiber is movable laterally across the wafer on the support with the dispenser arm, and wherein the end of the optical fiber is arranged adjacent the delivery port and the end of the optical fiber and the delivery port are positioned below the top edge of the sidewall and oriented to direct light onto the wafer substantially normal to the top face of the wafer; and
a controller configured to:
cause a probe provided by the end of the optical fiber to move laterally across the wafer such that the optical monitoring system generates measurements at a plurality of different radial positions on the wafer, receive a measurement of a spectrum reflected from the wafer,
determine, before starting the etch process, if an improper wafer is placed on the support by determining that a composition of a material determined does not match an expected composition based on comparing the measurement of the spectrum to a reference spectrum,
detect, before starting the etch process, if the wafer placed on the support is misplaced or there is any tilt of the wafer by determining a magnitude of the measurement of the reflected spectrum across the wafer, and determine an etching rate from the measurements to detect variations in an etching rate from a target etch rate profile, and to adjust a dwell time of the port or a flow rate of the etchant to reduce variations in the etching rate from the target etch rate profile.

2. The system of claim 1, wherein the controller is configured to detect misplacement of the wafer on the support.

3. The system of claim 1, wherein the controller is configured to at least one of indicate an alert to change an etchant bath or adjust a processing parameter of the etchant bath in a reservoir to reduce a variation of etching rate from the target etch rate profile.

4. The system of claim 3, wherein the processing parameter comprises a concentration of etchant.

5. The system of claim 3, wherein the controller is configured to adjust the processing parameter for a subsequent wafer to be processed on the support.

6. The system of claim 5, wherein the controller is configured to store a starting thickness, to determine that a processing endpoint has been reached from the measurements, to measure an elapsed time from a starting of etching until the processing endpoint, and to determine the etching rate from the starting thickness and the elapsed time.

7. The system of claim 1, wherein the controller is configured to determine, based on a wavelength of an intensity peak in the spectrum, the composition of the material from which the light was reflected.

8. The system of claim 1, wherein the controller is configured to determine the composition of the material from which the light was reflected based on two wavelength bands from the spectrum.

9. A substrate etching system, comprising:
 a housing including a floor and a sidewall extending upwardly from the floor;
 a rotatable spindle that extends through the floor;
 a support on the rotatable spindle and positioned above the floor of the housing to hold a wafer in a face-up orientation in a volume enclosed by the housing and below a top edge of the sidewall;
 a dispenser arm movable laterally over the top edge of the sidewall and across the wafer on the support, the dispenser arm supporting a delivery port extending downwardly below the top edge of the sidewall to selectively dispense a liquid etchant onto a portion of a top face of the wafer;
 an optical monitoring system comprising a light source, a spectrometer, and an optical fiber to carry light from the light source to the wafer and carry reflected light from the wafer to the spectrometer, wherein an end of the optical fiber is secured to the dispenser arm adjacent the delivery port such that the end of the optical fiber is movable laterally across the wafer on the support with the dispenser arm, and wherein the end of the optical fiber is arranged adjacent the delivery port and the end of the optical fiber and the delivery port are positioned below the top edge of the sidewall and oriented to direct light onto the wafer substantially normal to the top face of the wafer; and
 a controller configured to:
  cause a probe provided by the end of the optical fiber to move laterally across the wafer such that the optical monitoring system generates measurements at a plurality of different radial positions on the wafer, receive a measurement of a spectrum reflected from the wafer,
  select annular zones for the measurements based on a position of the arm and determine azimuthal positions for the measurements based a spindle rotation rate of the rotatable spindle,
  determine, before starting the etch process, if an improper wafer is placed on the support by determining that a composition of a material determined does not match an expected composition based on comparing the measurement of the spectrum to a reference spectrum,
  detect, before starting the etch process, if the wafer placed on the support is misplaced or there is any tilt of the wafer by determining a magnitude of the measurement of the reflected spectrum across the wafer, and
  determine an etching rate from the measurements to detect variations in an etching rate from a target etch rate profile, and to adjust a dwell time of the port or a flow rate of the etchant to reduce variations in the etching rate from the target etch rate profile.

* * * * *